United States Patent
Lozano

(10) Patent No.: US 8,062,706 B2
(45) Date of Patent: Nov. 22, 2011

(54) RECOVERY OF MONOBUTYLTIN TRICHLORIDE

(75) Inventor: Wagner R. Lozano, Lexington, KY (US)

(73) Assignee: PPG Industries Ohio, Inc., Cleveland, OH (US)

( * ) Notice: Subject to any disclaimer, the term of this patent is extended or adjusted under 35 U.S.C. 154(b) by 330 days.

(21) Appl. No.: 12/414,818

(22) Filed: Mar. 31, 2009

(65) Prior Publication Data

US 2010/0247926 A1    Sep. 30, 2010

(51) Int. Cl.
    *C23C 16/08* (2006.01)
(52) U.S. Cl. ............... 427/255.19; 427/255.11
(58) Field of Classification Search .......... 427/255.19, 427/255.11, 248.1
See application file for complete search history.

(56) References Cited

U.S. PATENT DOCUMENTS

| | | | |
|---|---|---|---|
| 3,333,936 A | 8/1967 | Warren | 65/182 |
| 3,660,061 A | 5/1972 | Donley et al. | 65/32 |
| 3,931,264 A * | 1/1976 | Larkin et al. | 556/103 |
| 4,036,866 A * | 7/1977 | Larkin et al. | 556/103 |
| 4,144,362 A | 3/1979 | Larkin | |
| 4,402,722 A | 9/1983 | Edge | 65/99.3 |
| 4,590,096 A * | 5/1986 | Lindner | 427/109 |
| 4,853,257 A | 8/1989 | Henery | 427/166 |
| 5,356,718 A | 10/1994 | Athey et al. | 428/428 |
| 5,520,896 A | 5/1996 | de Graaf et al. | 423/240 R |
| 5,853,799 A * | 12/1998 | Larkin | 427/160 |
| 5,863,337 A | 1/1999 | Neuman et al. | 118/178 |

FOREIGN PATENT DOCUMENTS

EP    0 418 075 A1    3/1991

OTHER PUBLICATIONS

U.S. Appl. No. 09/434,823, filed Nov. 5, 1999, Neuman.
PCT Search Report, PCT/US2010/028472, dated Aug. 4, 2010.

* cited by examiner

*Primary Examiner* — Matthew Daniels
*Assistant Examiner* — Lisa Herring
(74) *Attorney, Agent, or Firm* — Andrew C Siminerio

(57) ABSTRACT

Monobutyltinchloride ("MBTC") is recovered from an effluent vapor stream of a chemical vapor deposition coating process practiced to deposit a fluorine doped tin oxide layer over a glass ribbon. The vapor stream is condensed to a temperature to increase the ratio of MBTC to water in the liquid condensate. The condensed liquid is stored in a phase separation tank to separate the condensed liquid into at least two layers. The layers are individually removed from the phase separation tank, and the layer from the phase separation tank having a density equal to or greater than 80% the density of MBTC is further processed through a vacuum distilling operation to provide MBTC of an acceptable quality to use in the recovered MBTC in the coating process. The recovered MBTC is added to the coating precursors of the chemical deposition process.

19 Claims, 4 Drawing Sheets

US 8,062,706 B2

RECOVERY OF MONOBUTYLTIN TRICHLORIDE

BACKGROUND OF THE INVENTION

1. Field of the Invention

This invention relates to the recovery of monobutyltin trichloride (hereinafter also referred to as "MBTC") from the effluent stream of a chemical vapor deposition (hereinafter also referred to as "CVD") coating process practiced to apply a tin oxide film to a substrate, and more particularly, to the recovery of MBTC and methyl isobutyl ketone (hereinafter also referred to as "MIBK") from the effluent stream of a CVD coating process practiced to apply a fluorine doped tin oxide film to a glass ribbon, and to introduce the recovered MBTC and MIBK to the CVD coating process, or any similar CVD coating process.

2. Discussion of the Present Technology

Environmental coatings are applied to glass sheets to selectively control the transmission of ultraviolet radiation, visible light, and infrared energy, e.g. fluorine doped tin oxide is applied by the chemical vapor deposition coating process to a glass ribbon to reflect infrared energy. The coating is of commercial interest because it reflects infrared energy to reduce the heating costs during the winter months and to reduce the load on the air conditioners during the summer months. In addition to reflecting infrared energy, the tin oxide doped with fluorine is electrically conductive making it useful in the manufacture of photovoltaic cells and electrically heated glass used for anti-fog commercial refrigerator doors, and heating systems for removing fog and ice from aircraft transparencies.

Although the presently available CVD coating processes for applying tin oxide are commercially acceptable, there are limitations. More particularly, the CVD coating processes usually include vaporizing coating precursors including MBTC, MIBK and water (hereinafter also referred to as "$H_2O$") to deposit a tin oxide film, and the addition of trifluoroacetic acid (hereinafter also referred to as "TFA") to deposit fluorine doped tin oxide film. As is appreciated by those skilled in the art, the MIBK, among other things, stabilizes the coating solution and increases the solubility of the TFA in MBTC. The efficiency of the CVD coating process for depositing the tin oxide film is less than 15% resulting in more than 85% of the MBTC in the coating precursors present in the effluent vapor stream of the coating process.

Exhaust channels are provided adjacent the coating zone or coating area to remove the effluent stream of vapor. As discussed below in more detail, a portion of the effluent stream of vapor is condensed, and a portion of the effluent stream of vapor is solidified and captured in a baghouse. The usual practice is to incinerate the condensate and to bury the solid waste products in accordance to federal, state and local environmental regulations.

As can be appreciated, by those skilled in the art, at the present time, MBTC is the most expensive component of the coating precursors. It would be advantageous, therefore, to provide a system and/or to practice a method at the coating facility, or at a chemical recovery facility to reclaim most, if not all, of the MBTC from the effluent coating vapors and to introduce the recovered MBTC back into the coating process.

SUMMARY OF THE INVENTION

This invention relates to a process to recover MBTC from an effluent vapor stream of a chemical vapor deposition process practiced to deposit a tin oxide over surface of a heated glass article. The process includes, among other things, cooling the effluent vapor stream to a temperature in the range of 50-190° Fahrenheit ("F") to provide a cooled effluent vapor including liquid waste and mist; phase separating the liquid waste; removing liquid waste having a density equal to or greater than 1.02 gm/cc from the phase separated liquid waste defined as reclaimed MBTC liquid waste and distilling the reclaimed MBTC liquid waste to recover reclaimed MBTC liquid from the reclaimed MBTC liquid waste, wherein the reclaimed MBTC liquid has greater than 90 weight percent MBTC.

Further, the invention relates to a method of applying a tin oxide coating to a heated glass article. The method includes, among other things, mixing precursors comprising at least monobutyltinchloride hereinafter referred to as MBTC, to provide a first coating composition; moving the glass article and a coating zone relative to one another; applying the first coating composition to a surface of the heated glass article, and withdrawing an effluent vapor stream from the coating zone; cooling the effluent vapor steam to a temperature in the range of 50-190° Fahrenheit ("F") to provide a cooled effluent vapor including liquid waste and mist; phase separating the liquid waste; removing liquid waste having a density equal to or greater than 1.02 gm/cc from the phase separated liquid waste to provide reclaimed MBTC liquid waste; distilling the reclaimed MBTC liquid waste to recover reclaimed MBTC liquid from the reclaimed MBTC liquid waste, wherein the reclaimed MBTC liquid has greater than 80 weight percent MBTC, and mixing amounts of the precursors and the reclaimed MBTC liquid as needed to provide a second coating composition.

Still further, the invention relates to a coated article made according to the above described method of applying a tin oxide coating to a heated glass article.

DETAILED DESCRIPTION OF THE INVENTION

Figure 1:
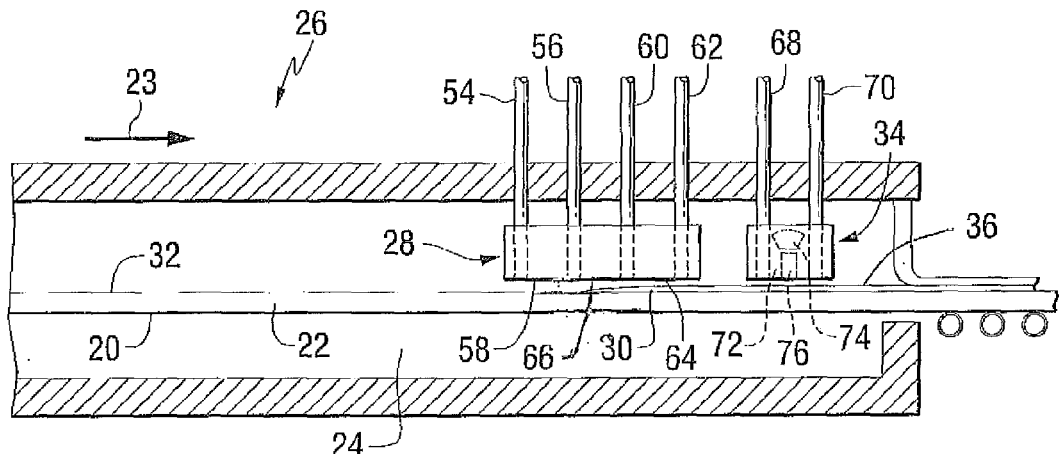
FIG. 1 is a partial cross sectional side view of a prior art glass forming chamber having chemical vapor deposition equipment that can be used in the practice of the invention.

As used herein, spatial or directional terms, such as "inner", "outer", "left", "right", "up", "down", "horizontal", "vertical", and the like, relate to the invention as it is shown in the drawing figures. However, it is to be understood that the invention can assume various alternative orientations and, accordingly, such terms are not to be considered as limiting. Further, all numbers expressing dimensions, physical characteristics, and so forth, used in the specification and claims are to be understood as being modified in all instances by the term "about". Accordingly, unless indicated to the contrary, the numerical values set forth in the following specification and claims can vary depending upon the desired property desired and/or sought to be obtained by the present invention. At the very least, and not as an attempt to limit the application of the doctrine of equivalents to the scope of the claims, each numerical parameter should at least be construed in light of the number of reported significant digits and by applying ordinary rounding techniques. Moreover, all ranges disclosed herein are to be understood to encompass any and all sub ranges subsumed therein. For example, a stated range of "1 to 10" should be considered to include any and all sub ranges between and inclusive of the minimum value of 1 and the maximum value of 10; that is, all sub ranges beginning with a minimum value of 1 or more and ending with a maximum value of 10 or less, e.g., 1 to 6.7, or 3.2 to 8.1, or 5.5 to 10. Also, as used herein, the term "moved over" "applied over" "deposited over" and "positioned over" means moved, applied, deposited, and positioned on but not necessarily in surface contact with. For example, one surface, article, film or component "moved over" "applied over" "deposited over" and "positioned over" another surface, article, film or component of an article does not preclude the presence of materials between the surfaces articles, or between components of the article, respectively.

Before discussing several non-limiting embodiments of the invention, it is understood that the invention is not limited in its application to the details of the particular non-limiting embodiments shown and discussed herein since the invention is capable of other embodiments. Further, the terminology used herein to discuss the invention is for the purpose of description and is not of limitation. Still further, unless indicated otherwise, in the following discussion like numbers refer to like elements.

Non-limiting embodiments of the invention include recovering MBTC, and MIBK from an effluent stream from a chemical vapor deposition coating process practiced to deposit a doped or an un-doped tin oxide film or layer over a surface of a substrate. As is appreciated, the invention is not limited to the CVD coating process, the substrate, the coated layer and/or the coated product. More particularly, the coating process can be of the type disclosed in the art, e.g. but not limited to U.S. Pat. Nos. 3,660,061; 4,853,257; and 5,863,337, which patents are hereby incorporated by reference, and the substrate can be any glass article, e.g. but not limited to a glass sheet, a glass bottle, or a continuous glass ribbon. The coating can be, but is not limited to, a tin oxide film over a glass substrate; a tin oxide film over an anti-iridescence film over a glass substrate; a doped tin oxide film over a glass substrate, e.g. but not limited to Sungate® 300 coated glass sold by PPG Industries, Inc., which includes a fluorine doped tin oxide film on a surface of a glass substrate, and a doped tin oxide film over an underlying film over a glass substrate e.g. but not limited to Sungate® 500 coated glass sold by PPG Industries, Inc., which includes a fluorine doped tin oxide film on an anti-iridescence film on a surface of a glass substrate. The coated products can include, but are not limited to coated transparencies, coated bottles, photovoltaic cells, electrically heated glass for anti-fog commercial refrigerator doors, and for aircraft transparencies.

Figure 2:
FIGS. 2-4 are side elevated partial views of prior art coated glasses that can be made according to the teachings of the invention.

In one non-limiting embodiment, the invention is practiced to recover MBTC and MIBK from the effluent stream of a CVD coating process practiced to deposit fluorine doped tin oxide film over on an anti-iridescence film deposited over a surface of a glass ribbon. With reference to FIG. 1, surface 20 of a glass ribbon 22 moving in the direction of arrow 23 floats on a pool of molten metal 24 contained in a glass forming chamber 26, e.g. but not limited to the type disclosed in U.S. Pat. Nos. 3,333,936 and 4,402,722; the disclosure of the patents is hereby incorporated by reference. As the glass ribbon 22 moves under CVD coating apparatus 28, an anti-iridescence film 30 is applied to surface 32 of the glass ribbon 22 (see also FIG. 2). Continued movement of the glass ribbon 22 in the direction of arrow 23 moves the glass ribbon 22 under CVD coating apparatus 34 to apply a fluorine-doped tin oxide film 36 (see FIG. 2) onto surface 38 of the anti-iridescence film 30.

In the preferred practice of the invention, the anti-iridescence film 30 is a gradient layer of tin oxide and silicon oxide, and is of the type disclosed in U.S. Pat. Nos. 5,356,718 and 5,863,337; the disclosures of the patents are hereby incorporated by reference. The percent of silicon oxide in the anti-iridescence film 30 decreases as the distance from the surface 32 of the glass ribbon 22 increases to provide a gradient anti-iridescence film 30 having about 100% silicon oxide at the surface 32 of the glass ribbon and about 100% tin oxide at the surface 38 of the anti-iridescence film 30 (see FIG. 2). For a detailed discussion of the chemistry and application of the anti-iridescence film 30 references can be made to U.S. Pat. Nos. 5,356,718 and 5,863,337.

Figure 3:
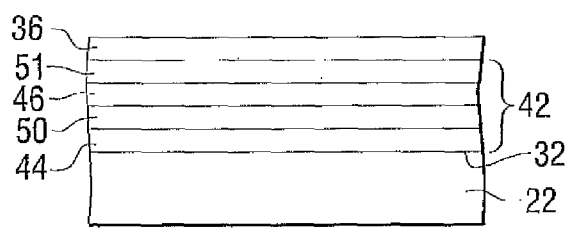
Figure 4:

As is appreciated, the invention is not limited to the gradient anti-iridescence film, and the invention contemplates an anti-iridescence layer having a plurality of homogeneous silicon oxide and tin oxide films. More particularly and not limiting to the invention, shown in FIG. 3 is an anti-iridescence layer 42. The anti-iridescence layer 42 includes tin oxide films 44 and 46 separated by silicon oxide films 50 and 51. For a detailed discussion of anti-iridescence layers having a plurality of homogeneous silicon oxide and tin oxide films reference can be made to U.S. patent application Ser. No. 09/434,823 filed Nov. 5, 1999, which patent application is hereby incorporated by reference. Optionally the anti-iridescence film 30 and layer 42 can be omitted, and the tin oxide or fluorine doped tin oxide film 36 can be applied directly to the surface 32 of the glass ribbon 22 as shown in FIG. 4.

With reference to FIG. 1, the CVD coating apparatus 28 for applying the anti-iridescence film 30 (see FIG. 2), or layer 42 (see FIG. 3) has an exhaust channel upstream and downstream of each coating zone, e.g. and not limiting to the invention, upstream exhaust channel 54 and downstream exhaust channel 56 about coating zone 58, and upstream exhaust channel 60 and downstream exhaust channel 62 about coating zone 64. Optionally, a coating zone 66 can be positioned between the exhaust channels 56 and 60. The effluent streams from the exhaust channels 54, 56, 60 and 62 are disposed of in any convenient manner and in accordance with local, state and federal environmental regulations.

With continued reference to FIG. 1, the CVD coating apparatus 34 for applying the fluorine doped tin oxide film 36 (see FIGS. 2-4) has an exhaust channel upstream and downstream of each coating zone, e.g. and not limiting to the invention, upstream exhaust channel 68 and downstream exhaust channel 70 about coating zone 72. As can be appreciated, the invention is not limited to the number of coating zones, and the CVD coating apparatus 34 can have 2 or more coating zones and associated upstream and downstream exhaust channels with each coating zone. The effluent streams from the exhaust channels 68 and 70 are treated in accordance to the teachings of the invention as discussed below.

In one non-limiting embodiment of the invention, a coating precursor of MBTC, MIBK, TFA, $H_2O$ is vaporized in chamber 74 of the coating apparatus 34 (see FIG. 1). The coating vapor is moved though slot nozzle 76 toward the surface 32 of the glass ribbon 22 to apply a fluorine doped tin oxide film on the anti-iridescence film 30 or layer 42 (see FIGS. 2 and 3), or on the surface 32 of the glass ribbon 22 (see FIG. 4). The coating vapors, the reaction vapors and gases are removed from the coating zone 72 by the exhaust channels 68 and 70. Generally the effluent stream from the exhausts 68 and 70 has captured greater than 85% of the MBTC coating precursor.

The invention is not limited to the weight percent of each of the components of the coating precursor, and the weight percent of each of the components is selected based on the thickness of the film to be deposited and the speed of the substrate, e.g. the glass ribbon 22. As is appreciated by those skilled in the art, the speed of the glass ribbon is dependant upon the thickness of the glass ribbon being produced. In one non-limiting embodiment of the invention, for a glass ribbon having a thickness in the range of 2-12 millimeters, a coating precursor gaseous mixture included 5-20 mole percent MBTC; greater than 0-0.2 mole percent MIBK; 5-15 mole percent TFA, and 0-10 mole percent of $H_2O$.

Figure 5:
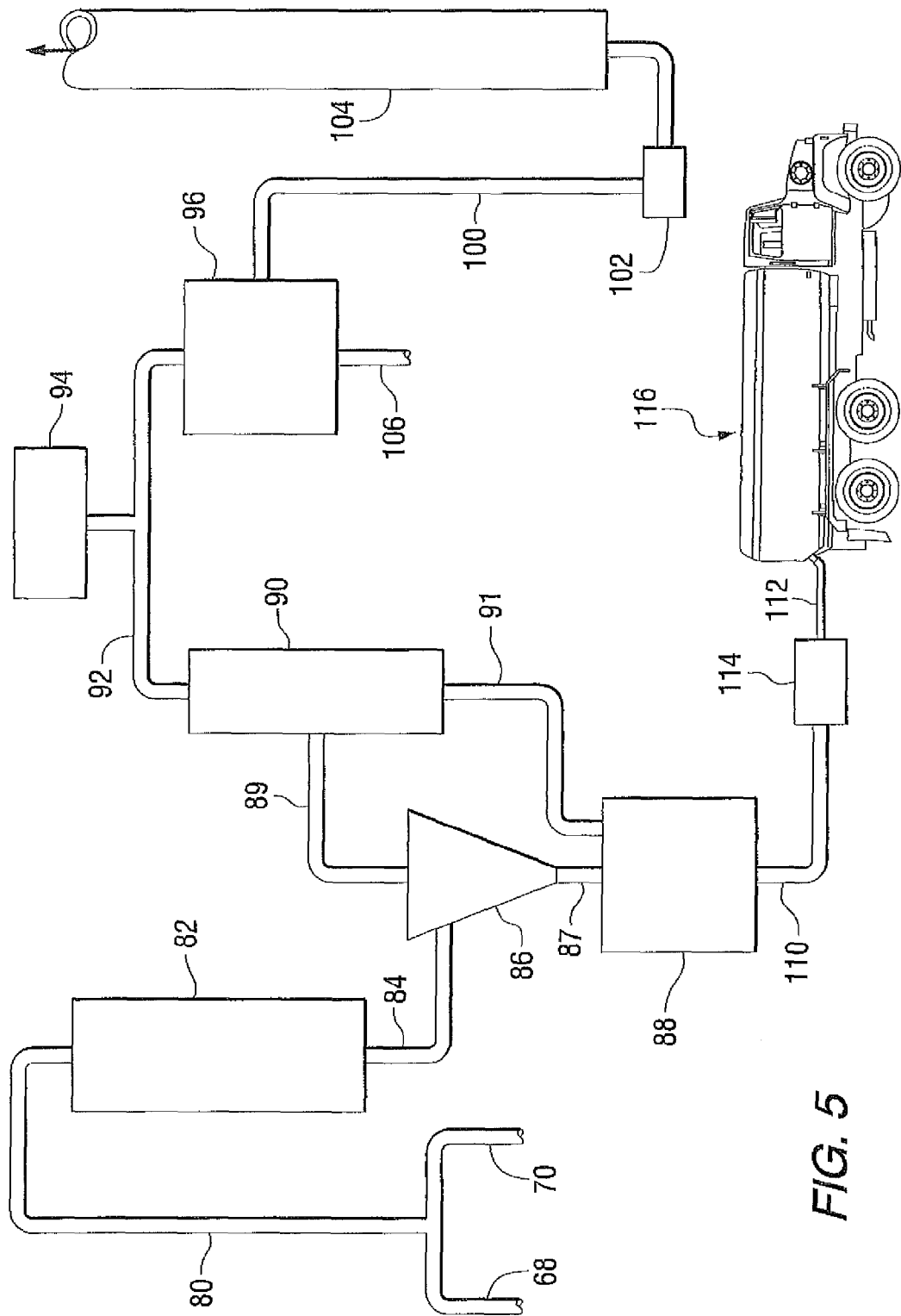
FIG. 5 is a flow diagram of a system to separate the effluent stream of the chemical vapor deposition equipment of FIG. 1 into a liquid waste, a solid waste and a gaseous waste in accordance to the teachings of the invention.

With reference to FIG. 5, at the present time, a method of disposing of the effluent stream from the exhaust channels 68 and 70 of the CVD coating apparatus 34 (see FIG. 5) includes passing the effluent stream of vapors from the exhaust channels 68 and 70 though conduit 80 to a condenser 82 to cool the effluent stream of vapors, from 300° Fahrenheit ("F") to 40° F. The liquid and mist (the mist includes gas, e.g. air and droplets of liquid) moves through conduit 84 to a cyclone separator 86 where the liquid is removed and is moved along conduit 87 to a storage tank 88. The mist from the cyclone separator 86 moves through conduit 89 to a mist eliminator 90 where the droplets in the mist are removed from the gas and moved through conduit 91 to the storage tank 88. The gas from the mist eliminator 90 moves through conduit 92. As the gas moves though the conduit 92, ammonia is injected into the gas by injector 94 to precipitate MBTC $NH_3$ adduct. The precipitate is removed by filters at baghouse 96. The remaining gas is removed from the baghouse 96 and is moved by the fan 102 through the conduit 100 to the emission stack 104. The MBTC $NH_3$ adduct precipitate in the baghouse 96 is dried and is properly disposed of (removal from the baghouse 96 designated by outlet 106), e.g. buried.

With continued reference to FIG. 5, the liquid (also referred to as "liquid waste") in the storage tank 88 has 4 parts MBTC for one part water. When sufficient liquid waste has accumulated in the storage tank 88, the liquid waste is moved by pump 114 from the storage tank 88 through conduits 110 and 112 to tank truck 116. The ratio of 4 parts of MBTC to one part water makes the cost of reclaiming the MBTC from the liquid waste too expensive, and the usual practice is to incinerate the liquid waste.

In the practice of the invention, the temperature of the condenser 82 is adjusted such that the condensate or cooled effluent stream from the condenser has a higher ratio of MBTC to water. More particularly, the effluent stream from the exhaust channels 68 and 70 moving into the condenser 82 has a temperature of about 300° F. The present practice is to reduce the temperature of the effluent stream from 300° F. to 40° F. In one embodiment of the invention, the temperature of the effluent stream is reduced from 300° F. to temperature in the range of 50-190° F. As the temperature of the liquid and the mist exiting the condenser 82 increases, the ratio of MBTC to water increases. More particularly, increasing the temperature of the effluent stream exiting the condenser 82 from 40° F. to a temperature in the range of 50-190° F. increases the ratio of MBTC to water moving into the storage tank 88 from 4 parts MBTC to one part water to 8-9.5 parts MBTC to one part water, more preferably, 9-9.5 parts MBTC to one part water. As is appreciated the invention is not limited to the temperature of the effluent stream as it exits the condenser 88, and the invention contemplates any temperature above 40° F., e.g. greater than 40° to 200° F.; 50° to 190° F.; 50 to 150° F., and 90-120° F. Although not limiting to the invention, as the amount of MBTC in the effluent stream increases, the difference between the temperature of the effluent steam entering the condenser 82, and the temperature of the liquid and mist exiting the condenser 82 decreases. In the practice of the invention, the temperature of the cooled effluent stream exiting the condenser 82 was 50° F.

Figure 6:
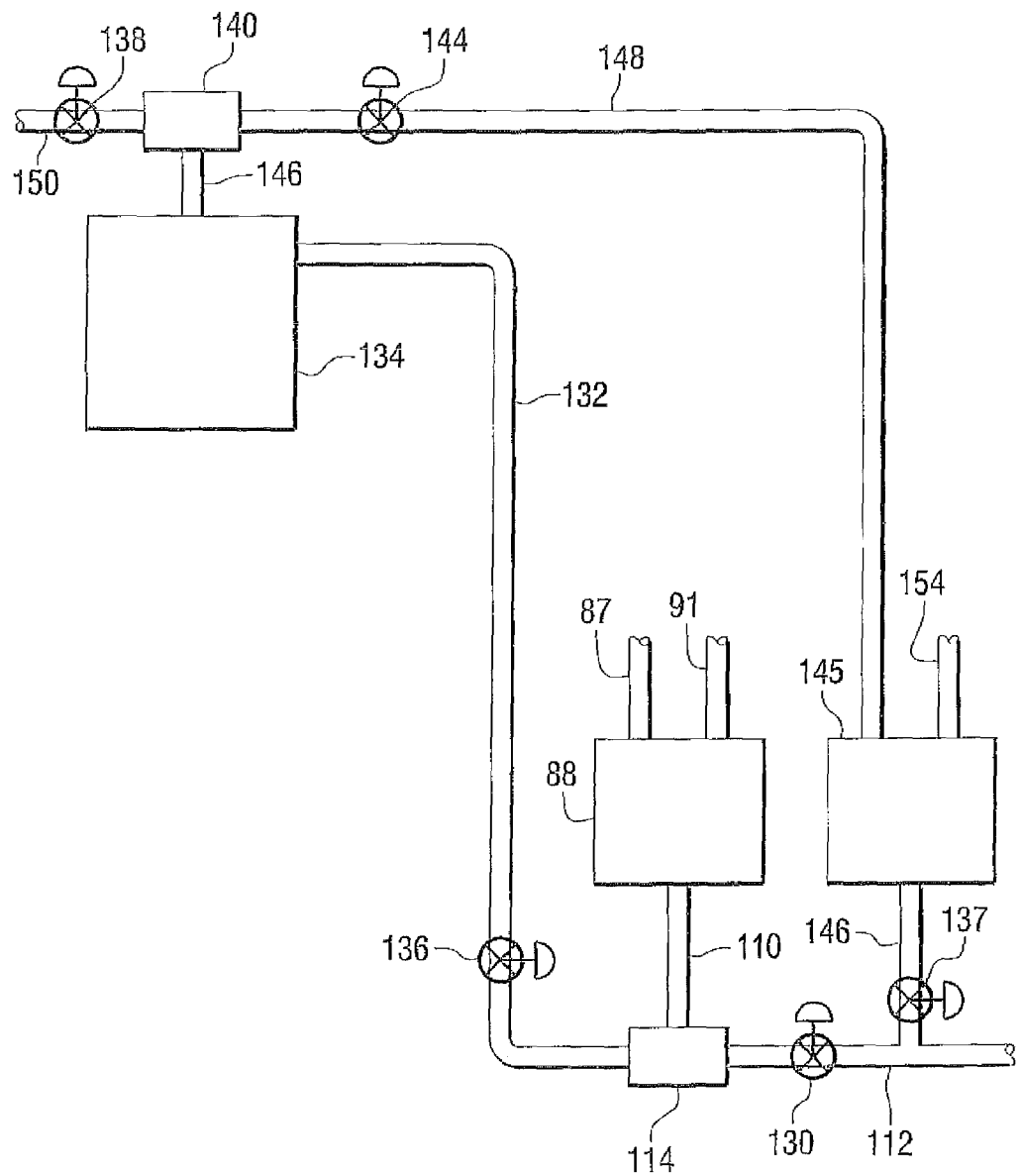
FIGS. 6-9 are flow diagrams of non-limiting embodiments of recovery systems of the invention to recover monobutyltinchloride from the liquid waste recovered, e.g. by the system of FIG. 5, from the effluent stream of the chemical vapor deposition equipment, e.g. the chemical vapor deposition equipment shown in FIG. 1.

With reference to FIG. 6, in one non-limiting embodiment of the invention, the conduit 112 between the pump 114 and the tank truck 116 can be removed or separated by a valve, e.g. valve 130 for the pump 114 to move the liquid waste from the storage tank 88 through conduit 132 to a phase separation tank 134. As can be appreciated, if the conduit 112 and the valve 130 are used, a valve 136 provided on the conduit 132 connects the pump 114 and the phase separator tank 134, and a valve 137 is provided on the conduit 146. The conduit 146 is discussed below. With this arrangement, the flow of the liquid waste into the storage tank 88 can be move to the tank truck 116 (see FIG. 5) by closing the valves 136 and 137, and opening the valve 130, or the liquid waste can be moved to the phase separation tank 134 by closing the valve 130 and opening the valve 136. After the liquid waste in phase separation tank 134 has attained a predetermined volume, the valve 136 is closed, and the liquid waste is maintained undisturbed in the phase separation tank 134 for 24-36 hours for phase separation of the liquid waste by density.

Based on chemical and physical analysis of phase separation and components, it is believed that the liquid waste separates into a bottom layer or a first layer of mostly MBTC with some MIBK; a second layer of mostly TFA with some $H_2O$ on the first layer; a third layer of $H_2O$ with some MIBK on the second layer, and a fourth layer of MIBK. MBTC has a density of 1.71 grams per cubic centimeter (gm/cc); TFA has a density of 1.48 gm/cc; $H_2O$ has a density of 1.00 gm/cc, and MIBK has a density of 0.80 gm/cc. The interface between the layers can be a mixture of the two layer making up the interface, e.g. the interface between the first layer of MBTC and MIBK, and the second layer of TFA and $H_2O$ can include MBTC, MIBK and/or TFA and/or $H_2O$, and the interface between the third layer and the fourth layer can include TFA, $H_2O$ and MIBK. As is appreciated the liquid waste can also include solid debris captured in the vapors from the coating zone.

The invention is not limited to the time period that the liquid waste is undisturbed and the time period can be less than 24 hours, e.g. 20, 16, or 12 hours, and the time period can be more than 36 hours, e.g. 40, 44 and unlimited number of hours. The period of time that the liquid waste remains undisturbed includes, but is not limited to 12-50 hours, 20-50 hours, 20-45 hours, 24-45 hours, 24-40 hours, 30-40 hours and 30-40 hours. The invention was practiced with a time period of 36 hours.

After the phase separation period ends, the layers of liquid waste are removed from the separation tank 134. The valve 138 on conduit 150 connected to pump 140 is closed (the connection to the conduit 150 is discussed below); the valve 144 between the pump 140 and storage tank 145 is opened, the valve 137 on the conduit 146 is closed. The pump 140 removes the fourth, third and second layers, e.g. the MIBK layer; the $H_2O$ and MIBK layer, and the TFA and $H_2O$ layer from the phase separation tank 134 through conduit 146 and moves the separated liquid waste through the open valve 144 and conduit 148 to collect the separated liquid waste in the storage tank 145. The separated liquid waste collected in the storage tank 145 is moved to the tank truck 116 (see FIG. 5) in any convenient manner at any convenient time, e.g. by closing the valves 130 and 144 and opening the valve 137 to flow the separated liquid waste from the storage tank 145 along the conduits 146 and 112 to the tank truck 116. As can be appreciated instead of collecting the separated liquid waste in the storage tank 145, the separated liquid waste can be collected in the tank truck 116.

A coriolis sensor was used to measure the density of the separated liquid waste as it flows from the phase separation tank 134. When the coriolis sensor indicates that the measured density of the liquid is equal to or greater than 75% of the density of MBTC, e.g. greater than 1.21, the valve 144 is closed and the valve 138 is opened to move the liquid waste in the phase separation tank 134, e.g. part of the third layer and the fourth layer (hereinafter also referred to as "reclaimed MBTC liquid waste") through the conduit 150. As is appreciated the invention is not limited to the density percent of MBTC, i.e. the density of the reclaimed MBTC liquid waste and contemplates moving the liquid waste through the conduit 148 until the density of the liquid waste is in the range of 50-100% (0.85-1.71 gm/cc), preferably 65-90% (1.02-1.54), and most preferably above 80% (1.37 gm/cc), of the MBTC density. In one non-limiting practice of the invention, the density of the reclaimed MBTC liquid waste was 1.62 gm/cc (95% of the density of MBTC) was used.

In one non-limiting embodiment of the invention, the reclaimed MBTC liquid waste is moved along conduit 150A (FIG. 7) for further processing at the coating facility, and in another non-limiting embodiment of the invention, the reclaimed MBTC liquid waste is moved along conduit 150B (FIG. 8) for processing at a location other than the coating facility.

Figure 7:
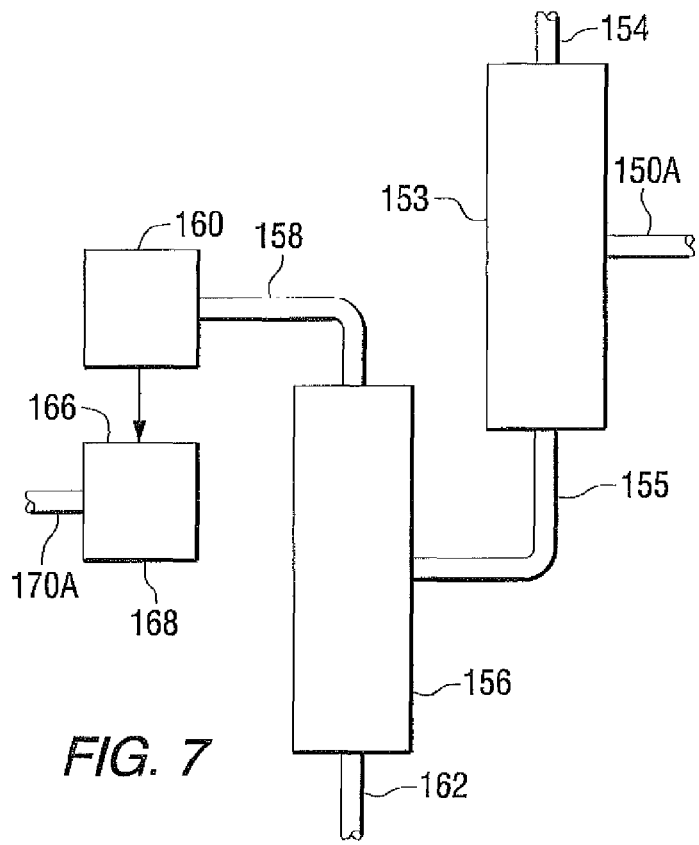

With reference to FIG. 7, in this non-limiting embodiment of the invention, the reclaimed MBTC liquid waste is processed at the coating facility. The reclaimed MBTC liquid waste is moved through conduit 150A to a first distillation column 153 operated at a temperature of 250° to 280° F. at a pressure of 22 inch of Hg (mercury) to remove residual liquid $H_2O$ and TFA in the reclaimed MBTC liquid waste. The liquid $H_2O$ and TFA are removed from the distillation column 153 through conduit 154 and moved to the storage tank 145 (see FIG. 6). The residual reclaimed MBTC liquid waste remaining in the distillation column 153 is moved in any convenient manner through conduit 155 to second vacuum distillation column 156. In one non-limiting embodiment of the invention, the residual reclaimed MBTC liquid waste has 80-90 weight percent ("wt %") MBTC; 0-5 wt % MIBK; 0-5 wt % TFA, and 0-10 wt % $H_2O$. The weight percent is based on the total weight of the residual reclaimed MBTC liquid waste.

The second distillation column 156 is operated at a temperature of 400° F. to 430° F. and a pressure of 22 inches of Hg to remove reclaimed MBTC liquid from the residual reclaimed liquid waste from the first distillation column 153. The reclaimed MBTC liquid from the second distillation column moves along conduit 158, and heavy molecular components, e.g. dimmer and trimmer remaining in the second distillation column 156 are moved out of the second distillation column 156 by conduit 162 and properly disposed of. In one non-limiting embodiment of the invention, the reclaimed MBTC liquid has greater than 90 wt %, e.g., 95-98 wt % MBTC; 0-5 wt %, e.g., greater than 0-5 wt % MIBK; 0-3 wt % TFA, and 0-0.2 wt % $H_2O$. The weight percent is based on the total weight of the reclaimed MBTC liquid.

Figure 9:
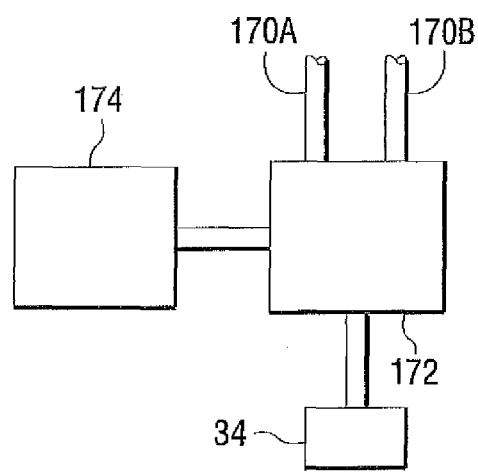

The reclaimed MBTC liquid from the second distilling column is moved through the conduit 158 and through filter 160 to remove any particles in the liquid. In the practice of the invention, a 5 micron sized filter was used in a pilot test. The reclaimed MBTC liquid is analyzed at 166 for coating quality, and if acceptable, MIBK and/or MBTC from supply 168 is added to the reclaimed MBTC liquid to bring the MIBK and MBTC in the reclaimed MBTC liquid up to the mole percent of the MBTC and MIBK in the liquid coating composition. The reclaimed MBTC liquid enhanced with MIBK and MBTC is moved through conduit 170A to mixing tank 172 (see FIG. 9) and mixed with the $H_2O$ and optionally the TFA from supply 174 to provide the coating precursor. The coating precursor is moved to the coating apparatus 34 to deposit a fluorine doped tin oxide layer over the glass ribbon 22 (see FIG. 1) as discussed above.

Figure 8:
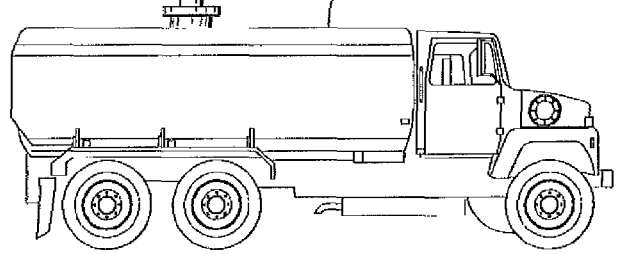

The following non-limiting embodiment of the invention was practiced. With reference to FIG. 8, the reclaimed MBTC liquid waste from the phase separation tank 134 (see 6) is moved along conduit 150B to a storage tank 176. When sufficient reclaimed liquid waste was collected, e.g. 2000 gallons, the reclaimed liquid waste was moved along conduit 178 to tank truck 180 and taken to the chemical processing facility (not shown) to obtain reclaimed MBTC liquid from the reclaimed MBTC liquid waste as discussed above. The reclaimed MBTC liquid was passed through a 20 micron polypropylene filter, and the filtered reclaimed MBTC liquid shipped to the coating plant (not shown). The filtered reclaimed MBTC liquid is passed through the conduit 158 and the filter 160 (see FIG. 7) and processed as discussed above.

As can now be appreciated, the invention is not limited to the number of distillation columns and the operating temperatures and pressures discussed above, and persons skilled in the art having the information provided herein can determine the optimum temperatures and pressures based on the equipment used.

As is appreciated, the invention is not limited to any particular coating process, and the MBTC reclaiming process of the invention can be used to reclaim MBTC, or MBTC and MIBK, from an effluent stream of any coating process in accordance to the teachings of the invention. Further, the invention is not limited to the arrangement of the equipment of the recovery system, and any arrangement of conduits, pumps, valves and recovery equipment, e.g. phase separation tank 134 and distilling columns 142 and 156 can be used in the practice of the invention. Still further, the reclaimed MBTC liquid does not have to mix with precursors for the coating apparatus which provided the effluent stream from which the MBTC was reclaimed, and the reclaimed MBTC liquid can be used with other coating apparatus.

It will be readily appreciated by those skilled in the art that modifications can be made to the non-limiting embodiments of the invention without departing from the concepts disclosed in the foregoing description. Accordingly, the particular non-limiting embodiments of the invention described in detail herein are illustrative only and are not limiting to the scope of the invention, which is to be given the full breadth of the appended claims and any and all equivalents thereof.

What is claimed is:

1. A process to recover monobutyltinchloride hereinafter referred to as MBTC from an effluent vapor stream of a chemical vapor deposition process practiced to deposit a tin oxide film over surface of a heated glass article, the process comprises:
    cooling the effluent vapor stream to a temperature in the range of 50-190° Fahrenheit ("F") to provide a cooled effluent vapor stream comprising liquid waste and mist;
    phase separating the liquid waste;

removing liquid waste having a density equal to or greater than 1.02 gm/cc from the phase separated liquid waste defined as reclaimed MBTC liquid waste, and distilling the reclaimed MBTC liquid waste to recover reclaimed MBTC liquid from the reclaimed MBTC liquid waste, wherein the reclaimed MBTC liquid has greater than 80 weight percent MBTC.

2. The process according to claim 1 further comprising separating the liquid waste and the mist, wherein the effluent vapor stream further comprises methyl isobutyl ketone hereinafter referred to as MIBK, and water, and the reclaimed MBTC liquid has greater than 90 wt % MBTC, 0-5 wt % MIBK and 0-0.2 wt % water.

3. The process according to claim 2 wherein the effluent vapor stream further comprises trifluoroacetic acid hereinafter also referred to as TFA and the reclaimed MBTC liquid has 95-98 percent MBTC, 0-5 percent MIBK, 0-0.2 percent water and 0-3 percent TFA.

4. The process according to claim 3, wherein the distilling of the reclaimed MBTC liquid waste to recover reclaimed MBTC liquid from the reclaimed MBTC liquid waste comprises a first distilling of the reclaimed MBTC liquid to remove water and TFA from the reclaimed MBTC liquid waste, and a second distilling to provide the reclaimed MBTC liquid.

5. The process according to claim 4, wherein the ratio of MBTC to water in the liquid waste is 9.5 to 1.

6. The process according to claim 5 wherein the reclaimed MBTC liquid waste has a density equal to or greater than 1.12 gm/cc.

7. The process according to claim 1, wherein the ratio of MBTC to water in the cooled effluent stream is 9.5 to 1.

8. The process according to claim 7 wherein the reclaimed MBTC liquid waste has a density equal to or greater than 1.12 gm/cc.

9. The process according to claim 1 wherein the reclaimed MBTC liquid waste has a density equal to or greater than 1.12 gm/cc.

10. A method of applying a tin oxide coating to a heated glass article, comprising:

mixing coating precursors comprising at least monobutyltinchloride hereinafter referred to as MBTC to provide a first coating composition;

moving the glass article and a coating zone relative to one another;

applying the first coating composition to a surface of the heated glass article;

withdrawing an effluent vapor stream from the coating zone;

cooling the effluent vapor stream to a temperature in the range of 50-190° Fahrenheit ("F") to provide a cooled effluent vapor stream comprising liquid waste and mist;

phase separating the liquid waste;

removing liquid waste from the phase separated liquid waste having a density equal to or greater than 1.02 gm/cc to provide reclaimed MBTC liquid waste;

distilling the reclaimed MBTC liquid waste to recover reclaimed MBTC liquid from the reclaimed MBTC liquid waste, wherein the reclaimed MBTC liquid has greater than 80 wt % MBTC, and mixing amounts of the precursors and the reclaimed MBTC liquid as needed to provide a second coating composition.

11. The method according to claim 10 wherein the second coating composition is selected from the group of coating compositions comprising the same amounts of the precursors of the first coating composition, and different amounts of the precursors of the first coating composition.

12. The method according to claim 10 wherein the effluent vapor stream further comprises methyl isobutyl ketone hereinafter referred to as MIBK and water, and the reclaimed MBTC liquid comprises greater than 90 wt % MBTC; greater than 0-5 wt % MIBK and 0-0.2 wt % water.

13. The method according to claim 12 wherein the effluent vapor stream further comprises TFA and the reclaimed MBTC liquid further comprises 0-3 wt % TFA.

14. The method according to claim 10, wherein the distilling of the reclaimed MBTC liquid waste to recover reclaimed MBTC liquid comprises a first distilling of the reclaimed MBTC liquid waste, and a second distilling of the reclaimed MBTC liquid waste to provide the reclaimed MBTC liquid.

15. The method according to claim 14, wherein the ratio of MBTC to water in the cooled effluent stream is 9.5 to 1.

16. The method according to claim 10 wherein the reclaimed MBTC liquid waste has a liquid density equal to or greater than 1.12 gm/cc.

17. The method according to claim 16 wherein the reclaimed MBTC liquid waste has a liquid density equal to or greater than 1.62 gm/cc.

18. The method according to claim 10 wherein the glass article is a flat piece of glass and at least one of the major surfaces of the glass is coated.

19. The method according to claim 18 wherein the glass is a continuous glass ribbon and the coating zone is in a flat glass forming chamber; the continuous glass ribbon has a surface supported on a pool of molten metal contained in the glass forming chamber, and the at least one major surface of the glass ribbon is a major surface of the glass ribbon opposite to the supported surface of the glass ribbon.

* * * * *